(12) United States Patent
Ichiroku et al.

(10) Patent No.: US 6,808,819 B2
(45) Date of Patent: Oct. 26, 2004

(54) HEAT RESISTANT RESIN COMPOSITION AND ADHESIVE FILM

(75) Inventors: Nobuhiro Ichiroku, Gunma-ken (JP); Toshio Shiobara, Gunma-ken (JP)

(73) Assignee: Shin Etsu Chemical Co., Ltd., Tokyo (JP)

( * ) Notice: Subject to any disclaimer, the term of this patent is extended or adjusted under 35 U.S.C. 154(b) by 64 days.

(21) Appl. No.: 10/366,388

(22) Filed: Feb. 14, 2003

(65) Prior Publication Data

US 2003/0158350 A1 Aug. 21, 2003

(30) Foreign Application Priority Data

Feb. 14, 2002 (JP) ....................................... 2002-036675

(51) Int. Cl.$^7$ .............................................. B32B 27/38
(52) U.S. Cl. .................... 428/473.5; 525/420; 525/423; 525/430; 525/507; 525/533; 525/928; 528/94; 528/114; 528/117; 528/408
(58) Field of Search ....................... 428/473.5; 525/420, 525/423, 430, 507, 533, 928; 528/94, 114, 117, 408

(56) References Cited

U.S. PATENT DOCUMENTS 5,446,074 A * 8/1995 Czornyj et al. ............. 522/164
5,677,393 A   10/1997 Ohmori et al.

FOREIGN PATENT DOCUMENTS

| JP | 5-9254 A | 1/1993 |
| JP | 6-116517 A | 4/1994 |
| JP | 6-200216 B2 | 7/1994 |
| JP | 6-271673 A | 9/1994 |
| JP | 10-60111 A | 3/1998 |

* cited by examiner

Primary Examiner—Philip Tucker
Assistant Examiner—D. Aylward
(74) Attorney, Agent, or Firm—Birch, Stewart, Kolasch & Birch, LLP

(57) ABSTRACT

A resin composition comprising the associated product of a polyimide resin having acid anhydride groups in the skeleton with an epoxy resin-curing catalyst, an epoxy resin, and optionally, an epoxy resin-curing agent has excellent adhesion, heat resistance, shelf stability and solvent resistance. An adhesive film comprising the resin composition is useful as an adhesive or sealant for printed circuit boards and semiconductor packages.

5 Claims, No Drawings

HEAT RESISTANT RESIN COMPOSITION AND ADHESIVE FILM

FIELD OF THE INVENTION

This invention relates to heat resistant resin compositions having a low modulus of elasticity, heat resistance and shelf stability and suited as adhesives and sealants for various printed circuit boards and semiconductor packages, and adhesive films using the same.

BACKGROUND OF THE INVENTION

In concert with the current demand for electronic equipment of smaller size and more multi-functions, the interconnection technology of printed circuit boards and semiconductor packages seeks for a higher density and further miniaturization. As a result, adhesives and adhesive films are required to have sufficiently high heat resistance and low modulus to accommodate the high-temperature process during mounting and relieve thermal stresses upon installation of electronic parts.

In the prior art, low modulus materials were developed by introducing siloxane structures into polyimides and polyamide-imides which are heat resistant resins. These siloxane-modified polyamide-imides are disclosed in JP-A 5-009254 and JP-A 6-116517. However, these resins are less adherent to copper foil and less heat resistant.

JP-A 10-060111 and JP-A 6-271673 discloses to blend a siloxane-modified polyamide-imide with a compound having at least two maleimide groups for improving high-temperature properties. This resin composition is less adherent, especially to copper foil. Japanese Patent No. 3,221,756 corresponding to U.S. Pat. No. 5,677,393 discloses a heat resistant adhesive film comprising a polyimide silicone having phenolic hydroxyl groups and an epoxy resin. Since the phenolic hydroxyl groups are located at sterically dense positions and thus hindered from reacting with the epoxy resin, the bonding effect of hydroxyl groups that arises from the reaction of phenolic hydroxyl groups with the epoxy resin is not expectable.

SUMMARY OF THE INVENTION

An object of the present invention is to provide a heat resistant resin composition having improved adhesion, heat resistance, shelf stability and solvent resistance as well as a low modulus of elasticity, and an adhesive film using the same.

We have found that a resin composition comprising the associated product of a polyimide resin having acid anhydride groups in the skeleton with a curing catalyst for epoxy resin, and preferably comprising the associated product, an epoxy resin having at least two glycidyl groups in a molecule and optionally, a curing agent for the epoxy resin cures into a part having a low modulus of elasticity and improved adhesion, heat resistance, and shelf stability. When the composition is applied to a support as varnish, an adhesive film is obtained which is fully adherent to copper foil or the like.

The term "adhesive film" as used herein preferably has a thickness of 5 to 500 µm and encompasses sheets.

Accordingly, the present invention provides a heat resistant resin composition comprising the associated product of a polyimide resin having acid anhydride groups in the skeleton with a curing catalyst for epoxy resin.

Preferably, the polyimide resin having acid anhydride groups in the skeleton comprises the reaction product of an acid anhydride having a functionality of at least 2 with an amine having a functionality of at least 2. The molar ratio of amine/acid anhydride ranges from 0.60 to 0.99.

In a preferred embodiment, the resin composition further includes an epoxy resin having at least two glycidyl groups in a molecule and optionally, a curing agent for the epoxy resin.

Also contemplated herein is an adhesive film comprising the heat resistant resin composition defined above.

DETAILED DESCRIPTION OF THE INVENTION

The heat resistant resin composition of the present invention comprises the associated product of a polyimide resin having acid anhydride groups in the skeleton with an epoxy resin-curing catalyst, and preferably the associated product, an epoxy resin having at least two glycidyl groups in a molecule and optionally, an epoxy resin-curing agent.

The polyimide resin used herein is obtained by reacting a di- or more functional amine component, preferably difunctional amine component with a di- or more functional acid anhydride component, preferably difunctional acid anhydride component. The di- or more functional acid anhydride component used in the preparation of the polyimide resin is not critical, and preferred examples include pyromellitic acid, 3,3',4,4'-benzophenonetetracarboxylic acid, 2,3,3',4'-biphenyltetracarboxylic acid, bis(3,4-carboxyphenyl)sulfone, 3,3',4,4'-biphenyltetracarboxylic acid, bis[4-(3,4-dicarboxyphenoxy)phenyl]-methane, bis[4-(3,4-dicarboxyphenoxy)phenyl]-ethane, 2,2-bis[4-(3,4-dicarboxyphenoxy)phenyl]-propane, bis(3,4-dicarboxyphenyl)difluoromethane, 2,2-bis(3,4-dicarboxyphenyl)hexafluoropropane, 1,3-bis(3,4-dicarboxyphenyl)-1,1,3,3-tetramethylsiloxane, bis[4-(3,4-dicarboxyphenoxy)phenyl]methane, bis(3,4-dicarboxyphenyl)ether, and reactive derivatives of the foregoing such as dianhydrides and esters, alone or in admixture of any.

The di- or more functional amine component used in the preparation of the polyimide resin is not critical and preferred examples include 4,4'-diaminodiphenylmethane, o-, m-or p-phenylenediamine, bis(4-(3-aminophenoxy)phenyl)-sulfone, 2,4-diaminotoluene, 2,5-diaminotoluene, 2,4-diaminoxylene, 2,4-diaminodurene, dimethyl-4,4'-diaminodiphenyl, dialkyl-4,4'-diaminodiphenyls, dimethoxy-4,4'-diaminodiphenyl, diethoxy-4,4'-diaminodiphenyl, 4,4'-diaminodiphenyl ether, 3,4'-diaminodiphenyl ether, 4,4'-diaminodiphenylsulfone, 3,3'-diaminodiphenylsulfone, 4,4'-diaminobenzophenone, 3,3'-diaminobenzophenone, 1,3-bis(3-aminophenoxy)benzene, 1,3-bis(4-aminophenoxy)benzene, 1,4-bis(4-aminophenoxy)benzene, 4,4'-bis(4-aminophenoxy)-biphenyl, bis(4-(4-aminophenoxy)phenyl)sulfone, 2,2'-bis(4-(4-aminophenoxy)phenyl)propane, 2,2-bis(4-(4-aminophenoxy)phenylhexafluoropropane, 2,2-bis(4-(3-aminophenoxy)phenyl)propane, 2,2-bis(4-(3-aminophenoxy)phenyl)hexafluoropropane, 2,2-bis(4-(4-amino-2-trifluoromethylphenoxy)phenyl) hexafluoropropane, 2,2-bis(4-(3-amino-5-trifluoromethylphenoxy)-phenyl)hexafluoropropane, 2,2-bis(4-aminophenyl)hexafluoropropane, 2,2-bis(3-aminophenyl)hexafluoropropane, 2,2-bis(3-amino-4-hydroxyphenyl)hexafluoropropane, 2,2-bis(3-amino-4-methylphenyl)hexafluoropropane, 4,4'-bis(4-aminophenoxy)octafluorobiphenyl, 2,2'-bis(trifluoromethyl) diaminodiphenyl, 3,5-diaminobenzotrifluoride, 2,5- diaminobenzotrifluoride, 3,3'-bistrifluoromethyl-4,4'-diaminobiphenyl, 3,3'-bistrifluoromethyl-5,5'-diaminobiphenyl, bis(trifluoromethyl)-4,4'-diaminodiphenyl, bis(fluorinated alkyl)-4,4'-diaminodiphenyls, dichloro-4,4'-diaminodiphenyl, dibromo-4,4'-diaminodiphenyl, bis(fluorinated alkoxy)-4,4'-diaminodiphenyls, diphenyl-4,4'-diaminodiphenyl, 4,4'-bis(4-aminotetrafluorophenoxy)tetrafluorobenzene, 4,4'-bis(4-aminotetrafluorophenoxy)octafluorobiphenyl, 4,4'-bisnaphthylamine, 4,4'-diaminobenzanilide, 4,4'-diamino(N-alkyl)benzanilides, alone or in admixture of any.

It is understood that a siloxane structure may be introduced into the polyimide resin of the invention for adjusting a modulus of elasticity and imparting flexibility and solubility. Suitable di- or more functional amine components having a siloxane structure introduced therein include siloxydiamines, diaminosiloxanes, and the like. Illustrative, non-limiting examples of the siloxydiamine include 1,3-bis(3-aminopropyl)-1,1,2,2-tetramethyldisiloxane, 1,3-bis(3-aminobutyl)-1,1,2,2-tetramethyldisiloxane, bis(4-aminophenoxy)dimethylsilane, and 1,3-bis(4-aminophenoxy)tetramethyldisiloxane.

The diaminosiloxanes include, for example, those of the following general formula:

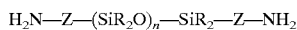

$$H_2N-Z-(SiR_2O)_n-SiR_2-Z-NH_2$$

wherein Z is a $C_{1-8}$ alkylene group, arylene group such as phenylene group, or alkylene-arylene group which may contain an oxygen atom for ether bond, R is independently selected from among $C_{1-8}$ alkyl or alkoxy groups which may be branched, and phenyl groups which may be substituted, and n is an integer of 4 to 60. Examples of the alkylene group represented by Z include ethylene, propylene, methylethylene, butylene, pentene, and hexene. Examples of the alkylene-arylene group which may contain an oxygen atom for ether bond include

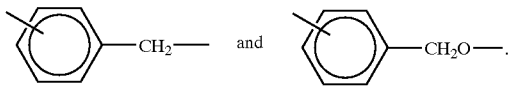

Examples of the alkyl group represented by R include methyl, ethyl, propyl, isopropyl, butyl, isobutyl, tert-butyl, pentyl, neopentyl, hexyl, cyclohexyl, octyl, nonyl and decyl; and examples of the alkoxy group represented by R include methoxy, ethoxy, propoxy, butoxy, tert-butoxy and pentoxy.

The diaminosiloxane is preferably used in such amounts that the siloxane component may account for 1 to 50 mol %, more preferably 2 to 40 mol % of the resulting polyimide resin. Less than 1 mol % of the siloxane component may be ineffective for imparting flexibility whereas more than 50 mol % of the siloxane component may increase moisture permeability and have an adverse impact on heat resistance.

In the preparation of the polyimide resin having acid anhydride groups in the skeleton, the di- or more functional amine component and the di- or more functional acid anhydride component are preferably reacted in a molar ratio of amine/acid anhydride (i.e., amino group in the amine component/acid anhydride group in the acid anhydride component) of from 0.60/1 to 0.99/1 and more preferably from 0.75/1 to 0.98/1. If the molar ratio of amine/acid anhydride is less than 0.60, there is formed a polyimide having a reduced chain length which sometimes fails to exert its crosslinking effect of imparting flexibility to the epoxy matrix. If the molar ratio of amine/acid anhydride is more than 0.99, there is formed a polyimide having in its skeleton less crosslink points with the epoxy resin, often failing to acquire the desired properties of epoxy-polyimide block copolymer.

The polyimide resin having acid anhydride groups in the skeleton is prepared, for example, by previously feeding the di- or more functional amine component and the di- or more functional acid anhydride component into a reactor, adding a solvent thereto, and heating. Preferably, in the reaction vessel, the di- or more functional amine component is dispersed or dissolved in the solvent, and the di- or more functional acid anhydride component dissolved or dispersed in the solvent is added dropwise at low temperature, followed by agitation and subsequent heating.

The solvents used in the preparation of the polyimide resin include commonly used solvents having a high dissolving power, for example, amide solvents such as N-methylpyrrolidone, N,N-dimethylformamide and N,N-dimethylacetamide; and oxygen-containing solvents, for example, lactones such as γ-butyrolactone, α-methyl-γ-butyrolactone, γ-valerolactone, δ-valerolactone, γ-caprolactone, and ε-caprolactone. Also included are carbonates such as ethylene carbonate and propylene carbonate, esters such as butyl acetate, ethyl cellosolve acetate and butyl cellosolve acetate, ethers such as dibutyl ether, diethylene glycol dimethyl ether, and triethylene glycol dimethyl ether, ketones such as methyl isobutyl ketone, cyclohexanone and acetophenone, alcohols such as butanol, octanol and ethyl cellosolve, as well as chain-like or cyclic amides, ureas, sulfoxides, sulfones, hydrocarbons and halogenated solvents. Any of these solvents may be added in such amounts that it does not adversely affect the stability of the resulting polyimide resin.

The other component used to form the associated product with the polyimide resin is a curing catalyst for epoxy resin. The curing catalyst is typically selected from secondary or lower amines, but not critical as long as it has a chemical structure capable of reacting with the acid anhydride to form amide bonds. Preferred epoxy resin-curing catalysts are imidazole derivatives having a hydrogen atom on a nitrogen atom, for example, 2-methylimidazole, 2-ethylimidazole, 2-ethyl-4-methylimidazole, 2-phenylimidazole, 2-phenyl-4-methylimidazole, 2-phenyl-4-methyl-5-hydroxymethylimidazole, and 2-phenyl-4,5-hydroxymethylimidazole. These imidazole derivatives may be used alone or in admixture of two or more.

An appropriate amount of the epoxy resin-curing catalyst added is 0.1 to 15 parts by weight, more preferably 0.2 to 10 parts by weight per 100 parts by weight of the polyimide resin. Too small an amount of the curing catalyst may result in under-cure and require a very high temperature to achieve curing whereas too large an amount of the curing catalyst may adversely affect the shelf stability of the resulting adhesive.

One exemplary method for the preparation of the associated product of the polyimide resin with the epoxy resin-curing catalyst involves the steps of adding the polyimide resin having acid anhydride groups and the epoxy resin-curing catalyst to a solvent as mentioned above, and agitating the mixture at room temperature for 30 minutes to 8 hours. If the reaction proceeds slowly, the reaction mixture may be heated up to about 150° C. If exothermic reaction takes place during the preparation of the associated product, the reaction mixture is preferably agitated in an ice bath.

In a preferred embodiment of the invention, the polyimide resin which is a resin having excellent heat resistance and electrical properties is compounded with an epoxy resin having at least two glycidyl groups in a molecule as a thermosetting resin, and optionally, a curing agent for the epoxy resin whereby the resin composition is endowed with better adhesion, heat resistance and solvent resistance. The epoxy resin used herein is not critical as long as it has at least two glycidyl groups in a molecule. Examples include glycidyl type (inclusive of methylglycidyl type) epoxy resins, for example, glycidyl ethers of phenols such as bisphenol type resins and novolak type resins including bisphenol A, bisphenol F, resorcinol, phenol novolac, and cresol novolac; glycidyl ethers of alcohols such as butane diol, polyethylene glycol, and polypropylene glycol; glycidyl esters of carboxylic acids such as phthalic acid, isophthalic acid and tetrahydrophthalic acid; derivatives of aniline and isocyanuric acid in which active hydrogen attached to the nitrogen atom is substituted with a glycidyl group; alicyclic epoxy resins obtained by epoxidizing olefin bonds within the molecule, such as vinylcyclohexene diepoxide, 3,4-epoxycyclohexylmethyl-3,4-epoxycyclohexanecarboxylate, and 2-(3,4-epoxy)cyclohexyl-5,5-spiro(3,4-epoxy)cyclohexane-m-dioxane; glycidyl ethers of p-xylylene-modified phenolic resins, glycidyl ethers of m-xylylene/p-xylylene-modified phenolic resins, glycidyl ethers of terpene-modified phenolic resins, glycidyl ethers of dicyclopentadiene-modified phenolic resins, glycidyl ethers of cyclopentadiene-modified phenolic resins, glycidyl ethers of polycyclic aromatic ring-modified phenolic resins, glycidyl ethers of naphthalene ring-containing phenolic resins, and biphenyl type epoxy resins. These resins may be used alone or in admixture of two or more.

In the composition of the invention, curing reaction takes place between acid anhydride groups in the associated product and epoxy groups in the epoxy resin. Then, further addition of a curing agent is not necessarily required. If desired, a curing agent for the epoxy resin is compounded in an effective amount. The epoxy resin-curing agent is not critical as long as it serves to cure the epoxy resin. For example, phenolic compounds, acid anhydrides and amine compounds are useful, with the phenolic compounds being preferred. Exemplary phenolic compounds include resins obtained by condensing or co-condensing a phenol such as phenol, cresol, xylenol, hydroquinone, resorcinol, catechol, bisphenol A or bisphenol F or a naphthol such as α-naphthol, β-naphthol or dihydroxynaphthalene, with an aldehyde such as formaldehyde, acetaldehyde, propionaldehyde, benzaldehyde or salicylaldehyde, in the presence of acidic catalysts; xylylene skeleton-bearing phenolic resins synthesized from phenols and dimethoxy-p-xylene or the like; phenolic resins having a dicyclopentadiene skeleton; phenolic resins having a cyclopentadiene skeleton; melamine-modified phenolic resins; terpene-modified phenolic resins; polycyclic aromatic-modified phenolic resins; and naphthol resins having a xylylene skeleton. These may be used alone or in admixture of two or more.

The epoxy resin-curing agent may be compounded with the epoxy resin in any desired proportion. When the curing agent used is a phenolic compound, it is preferably added in such amounts that the molar ratio of phenolic hydroxyl groups in the phenolic compound to epoxy groups in the epoxy resin is from 0.01 to 0.99, especially from 0.02 to 0.80.

According to the invention, curing reaction can be carried out by utilizing the reaction of acid anhydride groups with epoxy groups as mentioned above. Too small an amount of epoxy groups may lead to an insufficient bonding force to the adherend whereas too large an amount of epoxy groups, which means the presence of an excess of the epoxy resin by which a modulus of elasticity is increased, may prevent formation of a flexible adhesive sheet. For this reason, the associated product, the epoxy resin and the epoxy resin-curing agent are preferably blended such that the total amount of the epoxy resin and the epoxy resin-curing agent is about 1 to 900 parts by weight, especially about 5 to 400 parts by weight per 100 parts by weight of the associated product.

According to the invention, the associated product or a combination of the associated product, the epoxy resin-curing agent and the epoxy resin-curing catalyst is used as the component that causes the epoxy resin to cure. The chemical equivalent ratio between them is not critical although it is preferred that the equivalent ratio of epoxy groups in the epoxy resin to the total of acid anhydride groups in the polyimide resin+cure effective groups in the epoxy resin-curing agent+effective groups in the epoxy resin-curing catalyst be set in the range from 0.7 to 1.3, especially from 0.8 to 1.2. Controlling the ratio within this range can minimize unreacted residues of the components and thus suppress age degradation of adhesion, moisture absorption and electrical properties. The term "cure effective groups" is used herein to encompass, for example, phenolic hydroxyl groups in phenolic resins, and amino groups, amide groups and imidazole rings in amines.

Any other additives may be included in the heat resistant resin composition of the invention as long as they do not compromise the objects of the invention.

The heat resistant resin composition of the invention is prepared by compounding the associated product of polyimide resin with epoxy resin-curing catalyst, the epoxy resin, the epoxy resin-curing agent and other additives and thoroughly agitating and milling the mixture for 5 minutes or longer in order to prevent separation of the components.

The heat resistant resin composition thus obtained is dissolved in an aprotic polar solvent such as N-methylpyrrolidone (NMP) and directly used as varnish. When the composition in solution form is coated onto a support, there is obtained an adhesive film which is fully adherent to copper foil or the like. The adhesive film can be pressed together with a copper foil to produce a copper clad laminate having excellent adhesion and soldering heat resistance. It is noted that the thickness of the adhesive film is preferably 5 to 500 μm, especially 5 to 100 μm, though not critical.

The adhesive film of the invention can be cured by heating at a temperature of 160° C. or higher, preferably 200° C. or higher.

EXAMPLE

Synthesis examples and examples of the invention are given below by way of illustration, and are not intended to limit the scope of the invention.

The abbreviations used herein are as follows. BAPP is 2,2-bis[4-(4-aminophenoxy)phenyl]]propane, 6FDA is 2,2-bis(3,4-dicarboxyphenyl)hexafluoropropane, and 2 MZ is 1H,2-methylimidazole.

Synthesis Example 1

A 1-liter separable flask equipped with a reflux condenser coupled to a cocked 25-ml metering water container, thermometer and stirrer was charged with 35.67 parts by weight (30 mol %) of an aromatic diamine, BAPP and 200 parts by weight of cyclohexanone as a reaction solvent, as shown in Table 1. The diamine was dissolved in the solvent by agitating at 80° C. Then a solution containing 64.33 parts by weight (50 mol %) of 6FDA as an acid anhydride in 100 parts by weight of cyclohexanone was added dropwise to the solution, which was agitated for 8 hours at 80° C. for reaction. Thereafter, 25 ml of toluene was added and the temperature was then raised to about 160° C. at which reflux liquid or a cyclohexanone solution of a mixture of the polyimide resin and the epoxy resin-curing catalyst.

Note that Synthesis Example is abbreviated as SE in Tables.

TABLE 1

| Amount (pbw) | Synthesis Example 1 | | Synthesis Example 2 | | Synthesis Example 3 | | Synthesis Example 4 | |
|---|---|---|---|---|---|---|---|---|
| 6FDA | 64.33 | 50 mol % | 57.49 | 50 mol % | 39.75 | 50 mol % | 43.07 | 50 mol % |
| KF-8010 | 0.00 | 0 mol % | 0.00 | 0 mol % | 60.25 | 40 mol % | 48.97 | 30 mol % |
| BAPP | 35.67 | 30 mol % | 42.51 | 40 mol % | 0.00 | 0 mol % | 7.96 | 10 mol % |
| 2MZ | 4.75 | 20 mol % | 3.73 | 10 mol % | 2.58 | 10 mol % | 2.79 | 10 mol % |
| cyclohexanone | 300.00 | | 300.00 | | 300.00 | | 300.00 | |

TABLE 2

| Amount (pbw) | Synthesis Example 5 | | Synthesis Example 6 | | Synthesis Example 7 | | Synthesis Example 8 | |
|---|---|---|---|---|---|---|---|---|
| 6FDA | 51.97 | 45 mol % | 51.97 | 49.4 mol % | 34.54 | 45 mol % | 34.54 | 49.4 mol % |
| KF-8010 | 0.00 | 0 mol % | 0.00 | 0 mol % | 65.46 | 45 mol % | 65.46 | 49.4 mol % |
| BAPP | 48.03 | 45 mol % | 48.03 | 49.4 mol % | 0.00 | 0 mol % | 0.00 | 0 mol % |
| 2MZ | 3.73 | 10 mol % | 0.37 | 1.2 mol % | 2.58 | 10 mol % | 0.26 | 1.2 mol % |
| cyclohexanone | 300.00 | | 300.00 | | 300.00 | | 300.00 | | was continued for 2 hours. After it was confirmed that a predetermined amount of water collected in the metering water container and the outflow of water ceased, the toluene was completely removed at 160° C. while emptying the metering water container of the effluent. This yielded 400 parts by weight of a cyclohexanone solution of a polyimide resin having acid anhydride groups in the skeleton. To 400 parts by weight of the polyimide resin cyclohexanone solution was added 4.75 parts by weight (20 mol %) of 2 MZ as an epoxy resin-curing catalyst. The mixture was agitated at room temperature for 2 hours, yielding a brown clear liquid or a cyclohexanone solution of the polyimide resin associated with the epoxy resin-curing catalyst.

Synthesis Examples 2–4

Aside from dissolving an amount shown in Table 1 of a diamine (siloxanediamine KF-8010 by Shin-Etsu Chemical Co., Ltd. and/or aromatic diamine, BAPP) in 200 parts by weight of cyclohexanone, a cyclohexanone solution of a polyimide resin having acid anhydride groups in the skeleton was prepared according to Synthesis Example 1. To 400 parts by weight of the polyimide resin cyclohexanone solution was added an amount shown in Table 1 of 2 MZ. The mixture was agitated at room temperature for 2 hours, yielding a brown clear liquid or a cyclohexanone solution of the polyimide resin associated with the epoxy resin-curing catalyst.

Synthesis Examples 5–8

Aside from dissolving an amount shown in Table 2 of a diamine (siloxanediamine KF-8010 by Shin-Etsu Chemical Co., Ltd. or aromatic diamine, BAPP) in 200 parts by weight of cyclohexanone, a cyclohexanone solution of a polyimide resin was prepared according to Synthesis Example 1. To 400 parts by weight of the polyimide resin cyclohexanone solution was added an amount shown in Table 2 of 2 MZ. The mixture was agitated at room temperature for 24 hours, but the solution remained unchanged from a milky brown Examples 1–9 & Comparative Examples 1–9

To the cyclohexanone solutions of polyimide resin and 2 MZ obtained in Synthesis Examples 1 to 8, a difunctional epoxy resin RE310 (by Nippon Kayaku Co. Ltd., bisphenol A type epoxy resin, 180 g/Eq) and an epoxy resin-curing agent TD-2131 (Dainippon Ink & Chemicals Inc., phenol novolac resin, 110 g/Eq) were added in amounts shown in Tables 3 and 4. They were agitated to give a heat resistant resin composition. The composition was coated onto Teflon® film to such a buildup as to give a thickness of 50 μm after drying and dried at 80° C. for 30 minutes, forming an adhesive film on the Teflon film.

The adhesive films obtained in Examples 1–9 and Comparative Examples 1–9 were examined for solvent resistance, glass transition temperature, Young's modulus, and copper-polyimide bond strength by the following tests. The results are also shown in Tables 3 and 4.
Solvent resistance The adhesive film was peeled from the Teflon film, secured to a stainless steel frame, and heat treated at 175° C. for one hour for drying and curing. Acetone, 0.03 g, was dropped on the adhesive film of 20 mm×20 mm×50 μm (thick), which was allowed to stand at 25° C. for one hour. The film surface was visually observed to examine how the film was resistant to acetone attack.
Glass transition temperature (Tg)

The adhesive film was peeled from the Teflon film, secured to a stainless steel frame, and heat treated at 175° C. for one hour for drying and curing. The cured adhesive film of 20 mm×5 mm×50 μm (thick) was measured for Tg. Using a thermo-mechanical analyzer TMA-2000 (ULVAC Inc.), Tg was measured in the tensile mode under conditions: a chuck-to-chuck distance of 15 mm, a measuring temperature range of 25 to 300° C., a heating rate of 10° C./min, and a load of 10 g.
Young's modulus The adhesive film was peeled from the Teflon film, secured to a stainless steel frame, and heat treated at 175° C. for one hour for drying and curing. The cured adhesive film of 20 mm×5 mm×50 μm (thick) was measured for dynamic viscoelasticity. Using a dynamic viscoelasticity meter, Young's modulus at 25° C. was measured in the tensile mode under conditions: a chuck-to-chuck distance of 15 mm, a measuring temperature range of 20 to 300° C., a heating rate of 5° C./min, and a frequency of 30 Hz.

Copper-polyimide bond strength

The adhesive film was peeled from the Teflon film and sandwiched between a polyimide film and a copper foil. Under a pressure, the sandwich was passed twice between laminating rolls heated at 115° C. for press bonding. The press bonded laminate was heat treated in a nitrogen stream at 80° C. for 3 hours, at 120° C. for 2 hours, at 150° C. for 2 hours, and at 180° C. for 3 hours for thereby curing the adhesive film. The copper foil of the laminate was etched to produce a test piece complying with JIS C-6471, which was measured for bond strength.

The heat resistant film substrate used herein was a polyimide film of 25 μm thick, Kapton 100V by Dupont-Toray Co., Ltd. The copper foil used herein was a rolled copper foil of 35 μm thick, BHY22BT by Japan Energy Co., Ltd. The bond strength was measured using a tensile tester (Shimadzu Mfg. Co., Ltd.) at a pulling rate of 50 mm/min. A rotating drum type jig was used in 90 degree direction pulling.

Heat history bond strength

The adhesive film as dried at 80° C./30 min was further heated at 100° C. for 30 minutes as heat history. The adhesive film was then peeled from the Teflon film and sandwiched between a polyimide film and a copper foil. Under a pressure, the sandwich was passed twice between laminating rolls heated at 1150° C. for press bonding. The press bonded laminate was heat treated in a nitrogen stream at 80° C. for 3 hours, at 120° C. for 2 hours, at 150° C. for 2 hours, and at 180° C. for 3 hours for thereby curing the adhesive film. The copper foil of the laminate was etched to produce a test piece complying with JIS C-6471, which was measured for bond strength.

The heat resistant film substrate used herein was a polyimide film of 25 μm thick, Kapton 100V by Dupont-Toray Co., Ltd. The copper foil used herein was a rolled copper foil of 35 μm thick, BHY22BT by Japan Energy Co., Ltd. The bond strength was measured using a tensile tester (Shimadzu Mfg. Co., Ltd.) at a pulling rate of 50 mm/min. A rotating drum type jig was used in 90 degree direction pulling.

TABLE 3

| | Example | | | | | | | | |
|---|---|---|---|---|---|---|---|---|---|
| | 1 | 2 | 3 | 4 | 5 | 6 | 7 | 8 | 9 |
| Amount (pbw) | | | | | | | | | |
| RE310 | 5.21 | 2.33 | 0.81 | 1.61 | 3.22 | 6.44 | 1.75 | 3.49 | 3.22 |
| TD-2131 | | | | | | | | | 0.98 |
| Synthesis Example 1 | 100.00 | | | | | | | | |
| Synthesis Example 2 | | 100.00 | | | | | | | |
| Synthesis Example 3 | | | 100.00 | 100.00 | 100.00 | 100.00 | | | 50.00 |
| Synthesis Example 4 | | | | | | | 100.00 | 100.00 | |
| Measurement results | | | | | | | | | |
| Solvent resistance | insoluble | insoluble | insoluble | insoluble | insoluble | insoluble | insoluble | insoluble | insoluble |
| Tg (° C.) | 220 | 230 | 70 | 70 | 80 | 90 | 90 | 100 | 100 |
| Young's modulus (MPa) | 2200 | 2300 | 400 | 450 | 500 | 600 | 800 | 900 | 550 |
| Cu-polyimide bond strength (kg/cm) | 1.1 | 1.0 | 1.2 | 1.3 | 1.4 | 1.4 | 1.2 | 1.3 | 1.5 |
| Heat history bond strength (kg/cm) | 0.8 | 0.9 | 1.2 | 1.3 | 1.4 | 1.4 | 1.2 | 1.3 | 1.5 |

TABLE 4

| | Comparative Example | | | | | | | | |
|---|---|---|---|---|---|---|---|---|---|
| | 1 | 2 | 3 | 4 | 5 | 6 | 7 | 8 | 9 |
| Amount (pbw) | | | | | | | | | |
| RE310 | 2.33 | 2.33 | 0.81 | 1.61 | 3.22 | 6.44 | 1.61 | 3.22 | 3.22 |
| TD-2131 | | | | | | | | | 0.98 |
| Synthesis Example 5 | 100.00 | | | | | | | | |
| Synthesis Example 6 | | 100.00 | | | | | | | |
| Synthesis Example 7 | | | 100.00 | 100.00 | 100.00 | 100.00 | | | 50.00 |
| Synthesis Example 8 | | | | | | | 100.00 | 100.00 | |
| Measurement results | | | | | | | | | |
| Solvent resistance | swollen | swollen | dissolved | dissolved | insoluble | insoluble | dissolved | insoluble | insoluble |
| Tg (° C.) | 220 | 210 | 60 | 60 | 70 | 80 | 70 | 90 | 80 |
| Young's modulus (MPa) | 2500 | 2500 | 500 | 600 | 700 | 900 | 900 | 1000 | 700 |
| Cu-polyimide bond strength (kg/cm) | 0.9 | 0.9 | 1.0 | 1.1 | 1.3 | 1.3 | 1.2 | 1.2 | 1.4 |
| Heat history bond strength (kg/cm) | 0.6 | 0.8 | 0.9 | 0.8 | 0.7 | 0.6 | 0.6 | 0.7 | 0.8 |

As is evident from Tables 3 and 4, the adhesive films containing the polyimide resin having acid anhydride groups in the skeleton and the epoxy resin in Examples 1–9 were insoluble in acetone, with no indications of swelling or dissolution being observed. For the adhesive films containing the polyimide resin having no acid anhydride groups in the skeleton and the epoxy resin in Comparative Examples 1–9, indications of swelling or dissolution in acetone were observed.

As compared with the adhesive films containing the polyimide resin having no acid anhydride groups in the skeleton and the epoxy resin in Comparative Examples 1–9, the adhesive films containing the polyimide resin having acid anhydride groups in the skeleton and the epoxy resin in Examples 1–9 have a high Tg, a low Young's modulus, a high bond strength and a high bond strength after heat history.

The heat resistant resin compositions of the invention are applicable as varnishes, adhesives and adhesive films where adhesion, heat resistance, shelf stability and solvent resistance are required, and can find use in a wide variety of industries including paint, circuit board, electric, automotive, and building industries. As compared with prior art resins, the heat resistant resin compositions of the invention have good heat resistance and are also improved in drying, film formation and electric properties. They are also easy to handle since they are soluble in solvents. When the adhesive film of the invention is used as an insulating adhesive between layers, it prevents mechanical properties from being degraded by heating and improves interlaminar insulation resistance and reliability against heat. The adhesive film can be used even in the high-temperature process to which prior art resin compositions have never been applicable.

Japanese Patent Application No. 2002-036675 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A heat resistant resin composition comprising the associated product of a polyimide resin having acid anhydride groups in the skeleton with a curing catalyst for epoxy resin.

2. The resin composition of claim 1 wherein the polyimide resin having acid anhydride groups in the skeleton comprises the reaction product of an acid anhydride having a functionality of at least 2 with an amine having a functionality of at least 2, with the molar ratio of amine/acid anhydride being from 0.60 to 0.99.

3. The resin composition of claim 1, further comprising an epoxy resin having at least two glycidyl groups in a molecule.

4. The resin composition of claim 3, further comprising a curing agent for the epoxy resin.

5. An adhesive film comprising the heat resistant resin composition of claim 1.

* * * * *